(12) United States Patent
Iwaoka et al.

(10) Patent No.: US 10,287,676 B2
(45) Date of Patent: May 14, 2019

(54) THIN FILM FORMATION METHOD, THIN FILM, AND GLASS PLATE HAVING THIN FILM ATTACHED THERETO

(71) Applicant: AGC Inc., Chiyoda-ku (JP)

(72) Inventors: Hiroaki Iwaoka, Tokyo (JP); Atsushi Seki, Tokyo (JP); Kousuke Chonan, Tokyo (JP); Reo Usui, Tokyo (JP); Toshio Suzuki, Tokyo (JP); Tomomi Abe, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 141 days.

(21) Appl. No.: 15/157,936

(22) Filed: May 18, 2016

(65) Prior Publication Data

US 2016/0258055 A1 Sep. 8, 2016

Related U.S. Application Data

(63) Continuation of application No. PCT/JP2014/080241, filed on Nov. 14, 2014.

(30) Foreign Application Priority Data

Nov. 19, 2013 (JP) .................................. 2013-238795
Apr. 1, 2014 (JP) .................................. 2014-075636

(51) Int. Cl.
*B32B 15/04* (2006.01)
*B32B 17/06* (2006.01)

(Continued)

(52) U.S. Cl.
CPC ........ *C23C 16/405* (2013.01); *C03C 17/2456* (2013.01); *C03C 17/3417* (2013.01);
(Continued)

(58) Field of Classification Search
USPC .......................................................... 428/688
See application file for complete search history.

(56) References Cited

U.S. PATENT DOCUMENTS 5,776,254 A 7/1998 Yuuki et al.
2002/0182421 A1 12/2002 Tixhon
(Continued)

FOREIGN PATENT DOCUMENTS

JP 8-176826 7/1996
JP 10-202776 A 8/1998
(Continued)

OTHER PUBLICATIONS

Australian Examination Report, 2018, p. 1-3.*
(Continued)

*Primary Examiner* — Lauren R Colgan
(74) *Attorney, Agent, or Firm* — Oblon, McClelland, Maier & Neustadt, L.L.P.

(57) ABSTRACT

The present invention relates to a method for forming a $TiO_2$ thin film on a substrate by using an atmospheric pressure CVD method, in which a raw material gas contains titanium tetraisopropoxide (TTIP) and a chloride of a metal M vaporizable in a temperature range of 100 to 400° C. and the amount of the chloride of the metal M is from 0.01 to 0.18 as a concentration ratio to the titanium tetraisopropoxide (TTIP) (chloride of metal M (mol %)/TTIP (mol %)).

4 Claims, 5 Drawing Sheets

(51) Int. Cl.
*C23C 16/40* (2006.01)
*C03C 17/245* (2006.01)
*C03C 17/34* (2006.01)
*C09D 1/00* (2006.01)

(52) U.S. Cl.
CPC .......... *C09D 1/00* (2013.01); *C03C 2217/212* (2013.01); *C03C 2217/73* (2013.01); *C03C 2217/77* (2013.01); *C03C 2218/1525* (2013.01)

(56) References Cited

U.S. PATENT DOCUMENTS

| 2004/0028911 | A1 | 2/2004 | Hurst et al. | |
|---|---|---|---|---|
| 2008/0158674 | A1 | 7/2008 | Isano | |
| 2011/0132442 | A1* | 6/2011 | Higashi | H01L 31/022466 136/252 |
| 2011/0256325 | A1* | 10/2011 | Sanderson | B32B 17/10036 428/34 |
| 2012/0118362 | A1 | 5/2012 | Matsui et al. | |

FOREIGN PATENT DOCUMENTS

| JP | 2002-509516 | 3/2002 |
|---|---|---|
| JP | 2004-507430 | 3/2004 |
| JP | 2005-119920 | 5/2005 |
| JP | 2005-289802 A | 10/2005 |
| JP | 2008-164680 | 7/2008 |
| WO | WO 99/48828 | 9/1999 |
| WO | WO 02/18287 A1 | 3/2002 |
| WO | WO 2011/013719 A1 | 2/2011 |
| WO | WO 2013/008894 A1 | 1/2013 |

OTHER PUBLICATIONS

MacKenzie et. al. Physical Properties of Trichlorosilane and its Derivatives, vol. 72, 2032-2033, 1950.*
Extended European Search Report dated May 31, 2017 in European Patent Application No. 14864598.9.
Sapna Ponja, et al. "Aerosol assisted chemical vapour deposition of hydrophobic $TiO_2$—$SnO_2$ composite film with novel microstructure and enhanced photocatalytic activity", Journal of Materials Chemistry A: vol. 1, No. 20, XP055374582, Apr. 12, 2013, pp. 6271-6278.
International Search Report dated Feb. 17, 2015 in PCT/JP2014/080241 filed on Nov. 14, 2014 (with English translation).
Written Opinion dated Feb. 17, 2015 in PCT/JP2014/080241 filed on Nov. 14, 2014.

* cited by examiner

Reactivity High

THIN FILM FORMATION METHOD, THIN FILM, AND GLASS PLATE HAVING THIN FILM ATTACHED THERETO

CROSS-REFERENCE TO RELATED APPLICATIONS

This application is a Continuation of PCT/JP2014/080241, which was filed on Nov. 14, 2014. This application is based upon and claims the benefit of priority to Japanese Application No. 2014-075636, which was filed on Apr. 4, 2014, and to Japanese Application No. 2013-238795, which was filed on Nov. 19, 2013, the entire contents of which are incorporated herein by reference.

TECHNICAL FIELD

The present invention relates to a thin film formation method, a thin film and a glass sheet with a thin film. Specifically, it relates to a method for forming a thin film composed of titanium oxide ($TiO_2$) as a main component (hereinafter referred to as "$TiO_2$ thin film") on a substrate by using an atmospheric pressure CVD method, and a $TiO_2$ thin film and a glass sheet with a $TiO_2$ thin film, which are obtained by the method.

The $TiO_2$ thin film to be formed by the method of the present invention is, at the time of producing a thin film-type solar cell, suitable as various functional films to be formed on a substrate (e.g., a glass substrate) constituting a transparent substrate of the thin film-type solar cell, specifically as an alkali barrier layer and as an intermediate refractive index layer formed between the glass substrate and a tin oxide film constituting a transparent conductive film.

Moreover, the $TiO_2$ thin film to be formed by the method of the present invention is also suitable as various functional films to be formed on a substrate for the other use applications, specifically as a layer constituting a part of an antireflection film, as a surface layer for Low-E (Low-emissivity) glass that is excellent in heat insulation effect and as a reflection amplifying layer of a sunlight collecting glass.

BACKGROUND ART

As mentioned above, a $TiO_2$ thin film may be formed on a substrate for various purposes, and a method of forming a $TiO_2$ thin film on a substrate by an atmospheric pressure CVD method has been proposed.

In the case where a $TiO_2$ thin film is formed as a layer constituting a part of an antireflection film, a silicone oxide ($SiO_2$) thin film as a low refractive index film having a refractive index lower than that of $TiO_2$ and the $TiO_2$ thin film are alternately laminated. Here, in the case where the $SiO_2$ thin film and the $TiO_2$ thin film are formed by using the atmospheric pressure CVD method, the deposition rates of these thin films are desired to be high from the viewpoint of an improvement in productivity.

Also in the aforementioned other use applications, the deposition rate at the time of $TiO_2$ thin film formation by the atmospheric pressure CVD method is desired to be high from the viewpoint of an improvement in productivity.

Furthermore, for example, Patent Document 1 discloses a method for forming a thin film of tin-containing titanium oxide, which exhibits a photocatalytic activity, mainly by a CVD method in a float bath while adding highly reactive titanium chloride as a main raw material and an ester or the like as an oxygen source.

PRIOR ART DOCUMENT

Patent Document

Patent Document 1: JP-T-2004-507430

SUMMARY OF THE INVENTION

Problems that the Invention is to Solve

However, since titanium chloride is highly reactive with water, there has been a problem that handling thereof in the air atmosphere is difficult. On the other hand, when a raw material other than titanium chloride, e.g., titanium tetraisopropoxide (TTIP) is used, its reactivity is not high as compared with titanium chloride, so that there has been a problem that it is difficult to secure deposition rate.

In order to solve the problems in the aforementioned conventional art, an object of the present invention is to improve the deposition rate at the time of forming a $TiO_2$ thin film on a substrate by using an atmospheric pressure CVD method.

Means for Solving the Problems

In order to accomplish the above object, the present inventors have conducted extensive studies and as a result, have found that the deposition rate can be improved without deteriorating optical properties of the $TiO_2$ thin film by using a specific raw material, specifically titanium tetraisopropoxide (TTIP) as a Ti raw material to be used at the time of $TiO_2$ thin film formation by an atmospheric pressure CVD method and by adding, as an auxiliary raw material, a minute amount of a metal chloride vaporizable under conditions for performing the atmospheric pressure CVD.

The present invention has been made based on the above findings and provides a method for forming a $TiO_2$ thin film on a substrate by using an atmospheric pressure CVD method, in which a raw material gas contains titanium tetraisopropoxide (TTIP) and a chloride of a metal M vaporizable in a temperature range of 100 to 400° C. and the amount of the chloride of the metal M is from 0.01 to 0.18 as a concentration ratio to the titanium tetraisopropoxide (TTIP) (chloride of metal M (mol %)/TTIP (mol %)).

In the method for forming a $TiO_2$ thin film of the present invention, the amount of the chloride of the metal M may be from 0.07 to 0.18 as a concentration ratio to the TTIP (chloride of metal M (mol %)/TTIP (mol %)).

In the method for forming a $TiO_2$ thin film of the present invention, the chloride of the metal M is preferably a tin chloride.

In the method for forming a $TiO_2$ thin film of the present invention, the tin chloride is preferably monobutyltin trichloride (MBTC) or tin tetrachloride ($SnCl_4$).

In the method for forming a $TiO_2$ thin film of the present invention, it is preferred that the substrate is a glass substrate and the temperature of the substrate at the time of forming the $TiO_2$ thin film is from 520 to 600° C.

In the method for forming a $TiO_2$ thin film of the present invention, an $SiO_2$ thin film may be formed on the substrate and the $TiO_2$ thin film may be formed on the $SiO_2$ thin film.

Moreover, the present invention provides a $TiO_2$ thin film which is obtained by the method for forming a $TiO_2$ thin film, and has a Cl content of $0.5 \times 10^{18}$ (atoms/cm$^3$) or more and $10 \times 10^{18}$ (atoms/cm$^3$) or less.

In the $TiO_2$ thin film of the present invention, when the film thickness of the $TiO_2$ thin film is taken as L (nm), the content ratio of an oxide of a metal M in terms of film thickness is preferably 0.002 L or more and 0.035 L or less, which is represented by a ratio of a content of the oxide of the metal M in terms of film thickness (virtual film thickness when replacement is performed with a thin film having a content of the oxide of the metal M of 100%) to the film thickness L of the $TiO_2$ thin film.

The $TiO_2$ thin film of the present invention has a film thickness distribution in a width direction defined by the following expression of preferably 4% or less per 1 m of the width.

> Film thickness distribution (%)={((Maximum film thickness among measuring points)/(Average film thickness among measuring points)×100)–((Minimum film thickness among measuring points)/(Average film thickness among measuring points)×100)}/Measured width (m)

Furthermore, in the $TiO_2$ thin film of the present invention, the ratio of a surface roughness Ra (nm) to a film thickness t (nm) (Ra/t) is preferably 0.01 or more and 0.05 or less.

In addition, the present invention provides a glass sheet with a $TiO_2$ thin film, which is obtained by the method for forming a $TiO_2$ thin film.

Advantageous Effect of the Invention

According to the present invention, the deposition rate at the time of forming a $TiO_2$ thin film on a substrate by using an atmospheric pressure CVD method is improved. This effect is exhibited also at the time of forming the $TiO_2$ thin film directly on a glass substrate but is remarkable at the time of forming the $TiO_2$ thin film on an $SiO_2$ thin film of a substrate having the $SiO_2$ thin film formed on a surface thereof.

Moreover, according to one embodiment of the present invention, film thickness distribution of the $TiO_2$ thin film in a width direction is suppressed to 4% or less per 1 m of the width.

Furthermore, in the case where the amount of the chloride of the metal M is from 0.07 to 0.18 as a concentration ratio to TTIP (chloride of metal M/TTIP), an effect of improving surface smoothness of the $TiO_2$ thin film is also exhibited.

MODES FOR CARRYING OUT THE INVENTION

The following will describe the method for forming a $TiO_2$ thin film, the $TiO_2$ thin film and the glass sheet with a $TiO_2$ thin film of the present invention by exemplifying specific embodiments.

In general, in the case where a $TiO_2$ thin film is formed by an atmospheric pressure CVD method, a Ti raw material is supplied on a substrate heated to a predetermined temperature and the Ti raw material is made to react with oxygen ($O_2$) to form the $TiO_2$ thin film. As the Ti raw material, titanium tetraisopropoxide (TTIP) and titanium chloride ($TiCl_4$) are generally used. Since TTIP does not contain highly reactive chlorine, reaction control thereof is easy and handling is simple and convenient even in the atmosphere containing moisture, for example. Titanium chloride ($TiCl_4$) is highly reactive and is advantageous when it is desired to enhance a deposition rate. However, $TiCl_4$ has such a problem that, in the case where it is supplied on a glass substrate, Na contained in the glass substrate and Cl contained in $TiCl_4$ react with each other to form NaCl and thus haze occurs. Therefore, in the method for forming a $TiO_2$ thin film of the present invention, TTIP is used as the Ti raw material.

Here, the reaction mechanism at the time of performing an atmospheric pressure CVD is considered as follows.

A Ti raw material supplied on a substrate is adsorbed on the substrate surface owing to electrostatic attraction or hydrogen bonding. The Ti raw material adsorbed on the substrate surface reacts with oxygen ($O_2$) to form $TiO_2$. When the reaction proceeds over the whole substrate surface, a $TiO_2$ thin film is formed.

Figure 1:
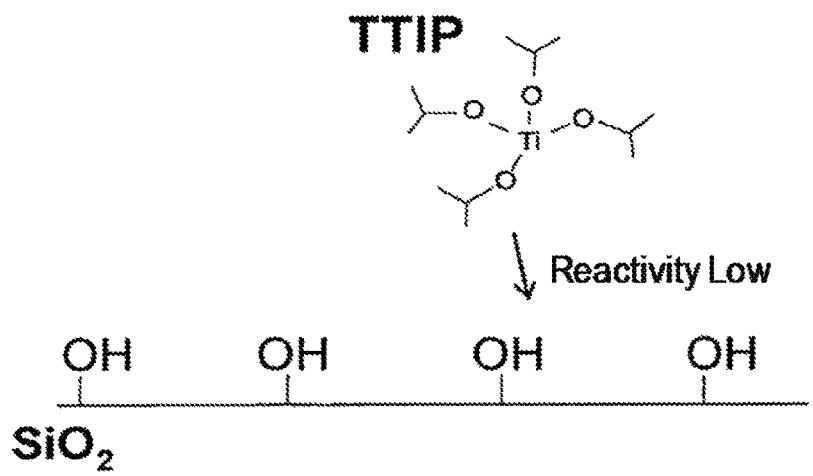
FIG. 1 is a view illustrating reactivity of TTIP on an $SiO_2$ thin film at the time of performing a usual atmospheric pressure CVD method.

FIG. 1 is a view illustrating reactivity of TTIP on an $SiO_2$ thin film in the case where a $TiO_2$ thin film is formed on the $SiO_2$ thin film, specifically reactivity between the surface of the $SiO_2$ thin film and TTIP supplied as the Ti raw material.

As illustrated in FIG. 1, on the surface of the $SiO_2$ thin film, there are a large number of —OH groups formed by, for example, the reaction with moisture in the air. The reactivity of the —OH group with an organic group moiety of TTIP is low. It is considered that this is because Lewis acidity of the —OH group on the surface of the $SiO_2$ thin film is low and hence the —OH group is less prone to dissociate. Therefore, the deposition rate is low in the case of forming the $TiO_2$ thin film on the $SiO_2$ thin film.

Figure 2:
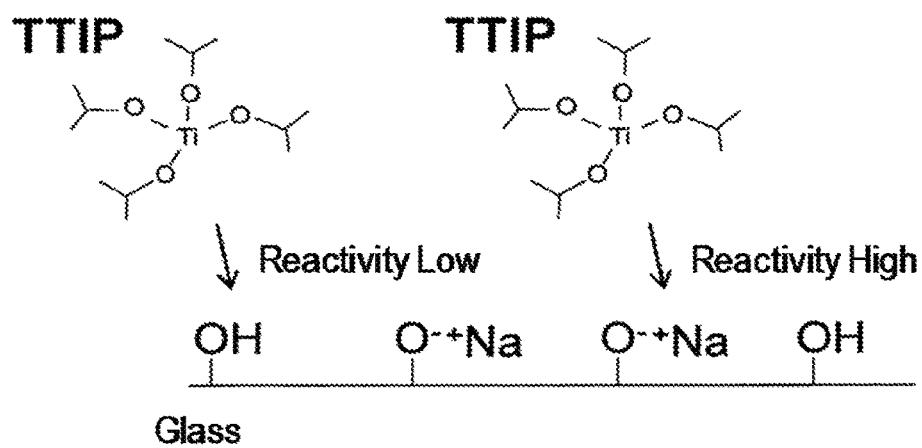
FIG. 2 is a view illustrating reactivity of TTIP on a glass substrate at the time of performing a usual atmospheric pressure CVD method.

FIG. 2 is a view illustrating reactivity of TTIP on a glass substrate in the case where a $TiO_2$ thin film is formed on the glass substrate, specifically reactivity between the surface of the glass substrate and TTIP supplied as the Ti raw material. A large number of —OH groups are also present on the surface of the glass substrate having $SiO_2$ as a main skeleton. Therefore, for the similar reason described in the case of forming a TiO$_2$ thin film on an SiO$_2$ thin film, the deposition rate tends to be low also in the case of forming the TiO$_2$ thin film on the glass substrate.

However, in the case of alkali-containing glass (glass containing an alkali metal oxide) such as soda lime silicate glass, as illustrated in FIG. 2, H of a part of the —OH groups is replaced with an alkali metal ion precipitated on the substrate surface. As compared with —OH group, the reactivity between the substituent (—ONa group in the figure) and the organic group moiety of TTIP is high. It is considered that this is because Lewis acidity of the —ONa group is higher than Lewis acidity of the —OH group on the substrate surface and hence the —ONa group is prone to dissociate as compared with the —OH group.

However, as illustrated in FIG. 2, since the —OH groups and the above substituents (—ONa groups in the figure) are unevenly distributed on the surface of the glass substrate that is an alkali-containing glass, there arises a difference in the deposition rate depending on the sites on the substrate surface. As a result, film thickness distribution occurs in the TiO$_2$ thin film formed on the substrate surface.

Incidentally, also at the time of forming a TiO$_2$ thin film on an SiO$_2$ thin film formed on a glass substrate, when the film thickness of the SiO$_2$ thin film is small, there is a case where the film thickness distribution occurs in the TiO$_2$ thin film to be formed, resulting from the precipitation of an alkali metal ion of the glass substrate on the surface of the SiO$_2$ thin film.

Figure 3:
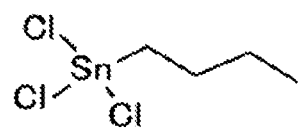
FIG. 3 is a view for explaining an action resulting from the addition of a tin chloride (MBTC) in one embodiment of the present invention and illustrates the action of MBTC on an $SiO_2$ thin film.
Figure 3:
Figure 3:
Figure 4:
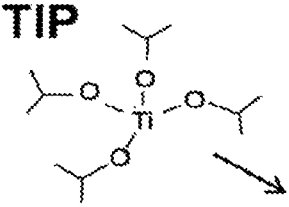
FIG. 4 is a view for explaining an action resulting from the addition of a tin chloride (MBTC) in one embodiment of the present invention and illustrates reactivity of TTIP on an $SiO_2$ thin film in the case where MBTC has been added.
Figure 4:
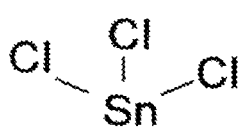
Figure 4:

FIGS. 3 and 4 are views illustrating reactivity of TTIP on an SiO$_2$ thin film in the case of forming a TiO$_2$ thin film on the SiO$_2$ thin film, specifically reactivity between the surface of the SiO$_2$ thin film and TTIP supplied as a Ti raw material, similarly to FIG. 1. However, in FIGS. 3 and 4, monobutyltin trichloride (MBTC) that is a tin chloride is added as an auxiliary raw material.

As illustrated in FIGS. 3 and 4, MBTC reacts with an —OH group present on the surface of the SiO$_2$ thin film to form an —OSnCl$_3$ group. As compared with the —OH group, the reactivity between the —OSnCl$_3$ group and the organic group moiety of TTIP is high. It is considered that this is because Lewis basicity is predominant in the reaction between the —OSnCl$_3$ group on the SiO$_2$ thin film surface and TTIP and thus the aforementioned influence of the Lewis acidity becomes relatively small. As a result, the deposition rate at the time of forming the TiO$_2$ thin film on the SiO$_2$ thin film becomes high.

In FIG. 4, a part of the —OH groups present on the surface of the SiO$_2$ thin film is illustrated in a state that the —OSnCl$_3$ group is formed through the reaction with MBTC. However, actually, it is considered that most of the —OH groups present on the surface of the SiO$_2$ thin film react with MBTC to form the —OSnCl$_3$ groups. Therefore, differently from the case illustrated in FIG. 2, the —OH groups and the —OSnCl$_3$ groups are not unevenly distributed on the surface of the glass substrate. Thereby, in the TiO$_2$ thin film formed on the substrate surface, the film thickness distribution is suppressed.

In the above, the action resulting from the addition of monobutyltin trichloride (MBTC) that is a tin chloride as an auxiliary raw material is described in the case of forming a TiO$_2$ thin film on an SiO$_2$ thin film. Also in the case of forming a TiO$_2$ thin film on a glass substrate, —OH groups present on the substrate surface react with MBTC to form —OSnCl$_3$ groups. As a result, the deposition rate at the time of forming the TiO$_2$ thin film on the glass substrate becomes high.

As illustrated in FIG. 2, in the case where —OH groups and substituents with an alkali metal ion precipitated on a substrate surface (—ONa groups in the figure) are unevenly distributed on the surface of the glass substrate, it is considered that most of these groups react with MBTC to form —OSnCl$_3$ groups. Therefore, differently from the case illustrated in FIG. 2, the —OH groups and the —OSnCl$_3$ groups are not unevenly distributed on the surface of the glass substrate. Thereby, in the TiO$_2$ thin film formed on the substrate surface, the film thickness distribution is suppressed.

However, when the addition amount of the monobutyltin trichloride (MBTC) that is a tin chloride as an auxiliary raw material is too large, the deposition rate rather decreases. It is considered that the reason is that tin mixes into the TiO$_2$ thin film as an impurity to inhibit crystallinity and thin film growth. It is surmised that when the addition amount is further increased, a vapor phase reaction of H$_2$O generated at the decomposition of MBTC with TTIP predominantly occurs and TTIP that is a main raw material is consumed before film formation and thus the deposition rate is decreased.

Moreover, in the above, the case of adding MBTC as an auxiliary raw material is described but it is considered that a similar effect is exhibited also in the case of adding another tin chloride such as SnCl$_4$, DBTC (dibutyltin chloride), or TBTC (tributyltin chloride), for a similar reason as in the aforementioned case of adding MBTC. In the case of adding SnCl$_4$, it is confirmed by Example to be mentioned later that the deposition rate becomes high.

Furthermore, also in the case of adding a chloride of a metal M other than tin, it is considered that a similar effect is exhibited. However, the chloride of the metal M is required to be vaporizable under conditions for performing an atmospheric pressure CVD method. Otherwise, it cannot be supplied on a substrate as a process gas.

Therefore, the chloride of the metal M is required to be vaporizable in a temperature range of 100 to 400° C. As specific examples of the chloride of the metal M satisfying the requirement, there may be mentioned AlCl$_3$ as a chloride of aluminum (Al) and TaCl$_5$ as a chloride of tantalum (Ta).

However, the addition of a tin chloride is preferred for the reasons of, for example, easy availability and inexpensiveness of the raw material. Among the tin chlorides, MBTC and SnCl$_4$ are preferred for the reasons of easy control of the reactivity in the vaporization process and the like, and MBTC is particularly preferred.

In one embodiment of the present invention, a chloride of a metal M vaporizable in the temperature range of 100 to 400° C. is added in an amount of 0.01 to 0.18 as a concentration ratio to TTIP (chloride of metal M (mol %)/TTIP (mol %)) (hereinafter simply referred to as "concentration ratio to TTIP").

When the concentration ratio to TTIP is less than 0.01, the effect of improving the deposition rate cannot be exhibited. On the other hand, when the concentration ratio to TTIP exceeds 0.18, the deposition rate rather decreases and also unevenness of the film thickness increases, so that the film thickness distribution occurs. The film thickness distribution in the present invention can be calculated according to the following expression after the thickness of the thin film is measured at 5 points or more (9 points in Examples to be mentioned later) along a width direction of the thin film. The interval between adjacent measuring points (measuring interval) is even and is 400 mm or less. Moreover, the distance between the measuring point located at the outermost in the width direction of the thin film and the edge of the thin film in the width direction is set to be ½ or less of the measuring interval.

Film thickness distribution (%)={((Maximum film thickness among measuring points)/(Average film thickness among measuring points)×100)−((Minimum film thickness among measuring points)/(Average film thickness among measuring points)×100)}/Measured width (m)

In the case where the addition amount of the chloride of the metal M is increased within the aforementioned range of the concentration ratio to TTIP, surface smoothness of the $TiO_2$ thin film to be formed is improved.

Figure 7:
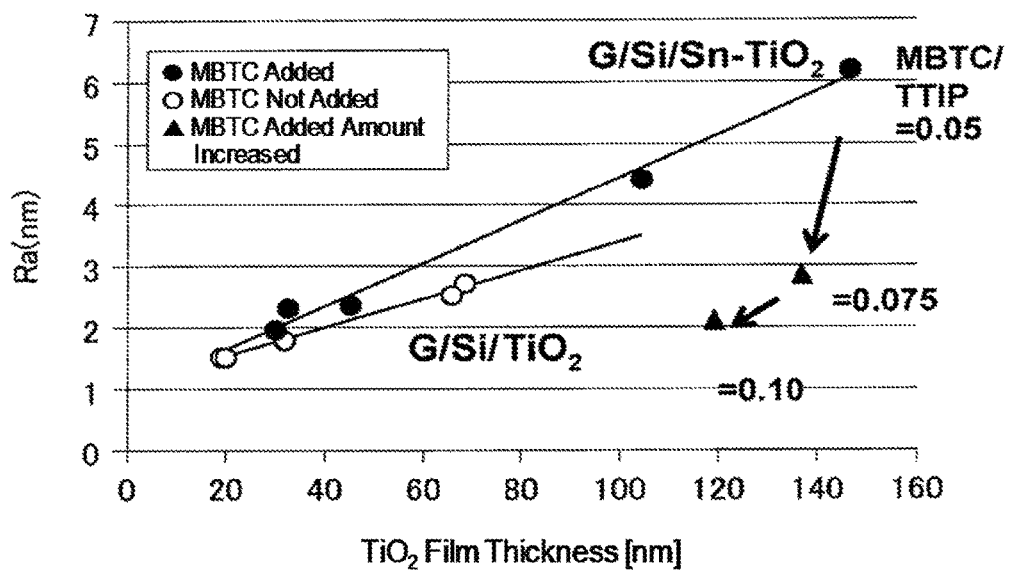
FIG. 7 is a graph showing a relationship between the film thickness of a $TiO_2$ thin film (nm) and the surface roughness Ra of the $TiO_2$ thin film (nm).

The surface smoothness of a $TiO_2$ thin film to be formed is relevant to crystallinity of the $TiO_2$ thin film, and the higher the crystallinity of the $TiO_2$ thin film is, the more the surface smoothness of the $TiO_2$ thin film deteriorates. In FIG. 7 to be mentioned later, it is considered that the reason why the surface smoothness deteriorates as the film thickness of the $TiO_2$ thin film increases is that the crystallinity of the $TiO_2$ thin film becomes high. In FIG. 7 to be mentioned later, in the case where the addition amount of MBTC that is a chloride of a metal M is increased, it is confirmed that the surface smoothness of the $TiO_2$ thin film is improved. It is considered that this is because the crystallinity of the $TiO_2$ thin film is lowered in the case where the addition amount of MBTC that is a chloride of a metal M is increased and thereby the surface smoothness of the $TiO_2$ thin film is improved.

In order to improve the deposition rate and improve the surface smoothness of the $TiO_2$ thin film to be formed, the chloride of the metal M is added in such an amount that the concentration ratio to TTIP is 0.07 or more. That is, the chloride of the metal M is added in such an amount that the concentration ratio to TTIP is from 0.07 to 0.18. Here, when the concentration ratio to TTIP is less than 0.07, the crystallinity of the $TiO_2$ thin film is prone to become high and therefore there is a concern that the surface roughness (Ra) of the $TiO_2$ thin film increases. Moreover, when the concentration ratio to TTIP exceeds 0.18, aggregation of tin particles is prone to occur and the surface roughness (Ra) of the $TiO_2$ thin film increases. The concentration ratio to TTIP is more preferably from 0.075 to 0.15 and further preferably from 0.075 to 0.1.

Furthermore, in one embodiment of the present invention, the substrate temperature at $TiO_2$ thin film formation is preferably from 400 to 650° C. from the viewpoint of an improvement in the deposition rate, more preferably from 450° C. to 600° C., further preferably from 520° C. to 600° C., and particularly preferably from 530° C. to 580° C. from the viewpoint of compatibility to the online forming process of sheet glass.

The following will further describe the method for forming a $TiO_2$ thin film of the present invention.

<Substrate>

The substrate on which a $TiO_2$ thin film is formed by the method of the present invention is not particularly limited and may be a ceramic-made substrate or a plastic-made substrate. However, a glass-made substrate is preferred since it has excellent transparency, high strength and good heat resistance.

As types of glass, there may be mentioned soda lime silicate glass, aluminosilicate glass, borate glass, lithium aluminosilicate glass, quartz glass, borosilicate glass, alkali-free glass, and the like. The glass is preferably colorless and transparent.

In the case of a glass substrate, the thickness is preferably from 0.2 to 6.0 mm. When the thickness of the glass substrate falls within this range, strength is high. When the degree of transparency of a substrate is expressed by transmittance, the substrate preferably has a transmittance of 80% or more. It is desirable that the glass substrate is sufficient in electrical insulating properties and has high chemical and physical durability.

<$SiO_2$ Thin Film>

As mentioned above, in the method of the present invention, the effect of improving the deposition rate is preferably exhibited in the case of forming a $TiO_2$ thin film on a $SiO_2$ thin film formed on the substrate. Here, the film thickness of the $SiO_2$ thin film formed on the substrate is not particularly limited and may be suitably selected depending on the purpose for forming the $SiO_2$ thin film.

In the case where the $SiO_2$ thin film is formed as an alkali barrier layer or an intermediate refractive index layer, film thickness thereof is preferably from 20 to 100 nm.

In the case where the $SiO_2$ thin film is formed as a layer constituting a part of an antireflection film, a surface layer for Low-E (Low-emissivity) glass that is excellent in heat insulation effect, or a reflection amplifying layer of a sunlight collecting glass, the following film thickness is preferred in each case.

A layer constituting a part of a three layered antireflection film: from 80 to 120 nm A layer constituting a part of a four layered antireflection film: from 70 to 110 nm A surface layer for Low-E glass: from 20 to 220 nm A reflection amplifying layer of a sunlight collecting glass: from 30 to 120 nm <$TiO_2$ Thin Film>

The film thickness of the $TiO_2$ thin film to be formed by the method of the present invention is also not particularly limited and may be suitably selected depending on the purpose for forming the $TiO_2$ thin film.

In the case where the $TiO_2$ thin film is formed as a layer constituting a part of an antireflection film, a surface layer for Low-E (Low-emissivity) glass that is excellent in heat insulation effect, or a reflection amplifying layer of a sunlight collecting glass, the following film thickness is preferred in each case.

A layer constituting a part of a three layered antireflection film: from 80 to 120 nm A layer constituting a part of a four layered antireflection film: from 70 to 110 nm A surface layer for Low-E glass: from 20 to 220 nm A reflection amplifying layer of a sunlight collecting glass: from 30 to 120 nm Since the chloride of the metal M is added to the raw material gas at the time of forming the $TiO_2$ thin film, the $TiO_2$ thin film formed by the method of the present invention contains chlorine (Cl). In the $TiO_2$ thin film formed by the method of the present invention, the content of chlorine (Cl) is preferably $0.5 \times 10^{18}$ (atoms/cm$^3$) or more and $10 \times 10^{18}$ (atoms/cm$^3$) or less, more preferably $2 \times 10^{18}$ (atoms/cm$^3$) or more and $7 \times 10^{18}$ (atoms/cm$^3$) or less, and further preferably $3 \times 10^{18}$ (atoms/cm$^3$) or more and $5 \times 10^{18}$ (atoms/cm$^3$) or less.

Conditions for measuring the content of chlorine (Cl) are as follows.

Measurement apparatus: ADEPT 1010 manufactured by Ulvac-Phi, Inc., Primary ion: Cs$^+$, Acceleration voltage: 3 (kV), Beam current: 150 (nA), Raster size: 400×400 (μm$^2$), Sample angle: 60(°)

Moreover, since the chloride of the metal M is added to the raw material gas at the time of forming the $TiO_2$ thin film, the TiO$_2$ thin film formed by the method of the present invention contains an oxide of the metal M (SnO$_2$ in the case where a tin chloride is added).

In the TiO$_2$ thin film formed by the method of the present invention, when the film thickness of the TiO$_2$ thin film is taken as L (nm), the content ratio of the oxide of the metal M in terms of film thickness (content ratio of SnO$_2$ in terms of film thickness in the case where a tin chloride is added to the raw material gas) is preferably 0.002 L or more and 0.035 L or less, more preferably 0.009 L or more and 0.03 L or less, and further preferably 0.012 L or more and 0.02 L or less.

In the present invention, the content in terms of film thickness represents virtual film thickness (nm) when the film thickness of a thin film is taken as L and a component contained in the thin film is replaced with a thin film composed of 100% of the component. For example, in the case where the thin film is formed of a mixed oxide of TiO$_2$ and tin oxide (SnO$_2$), it is virtual film thickness when the tin oxide contained therein is replaced with a thin film composed of 100% of the tin oxide. Moreover, the content ratio in terms of film thickness can be represented by a ratio of the aforementioned content (nm) in terms of film thickness to the film thickness L (nm) of the whole thin film (Ratio of SnO$_2$ content in terms of film thickness=SnO$_2$ content (nm) in terms of film thickness/Film thickness (nm) of the whole thin film×L).

Moreover, as mentioned above, in the TiO$_2$ thin film formed by the method of the present invention, the film thickness distribution is suppressed. In the TiO$_2$ thin film formed by the present invention, it is preferably 4% or less (within ±2%), more preferably 2% or less (within ±1%) and further preferably 1% or less (within ±0.5%), per 1 m of the width.

Furthermore, as mentioned above, in the TiO$_2$ thin film formed by the method of the present invention, the surface smoothness of the formed TiO$_2$ thin film is improved by increasing the addition amount of the chloride of the metal M within the aforementioned concentration ratio to TTIP. In the TiO$_2$ thin film formed by the present invention, when the film thickness of the TiO$_2$ thin film is taken as t (nm), a ratio of the surface roughness Ra (nm) to the film thickness t (nm) (Ra/t) is preferably 0.01 or more and 0.05 or less, more preferably 0.01 or more and 0.03 or less and further preferably 0.015 or more and 0.025 or less.

EXAMPLES

The present invention will be described in detail below with reference to Examples. However, the present invention should not be construed as being limited thereto.

Example 1

In the present Example, a TiO$_2$ thin film was formed on an SiO$_2$ thin film by using an atmospheric pressure CVD method.

The SiO$_2$ thin film was formed on a glass substrate (soda lime silicate glass substrate) and film thickness thereof was 30 nm.

As an auxiliary raw material, MBTC was added in an amount of 0 to 0.122 as a concentration ratio to TTIP (MBTC (mol %)/TTIP (mol %)).

The substrate temperature at the time of TiO$_2$ thin film formation was 550° C.

Figure 5:
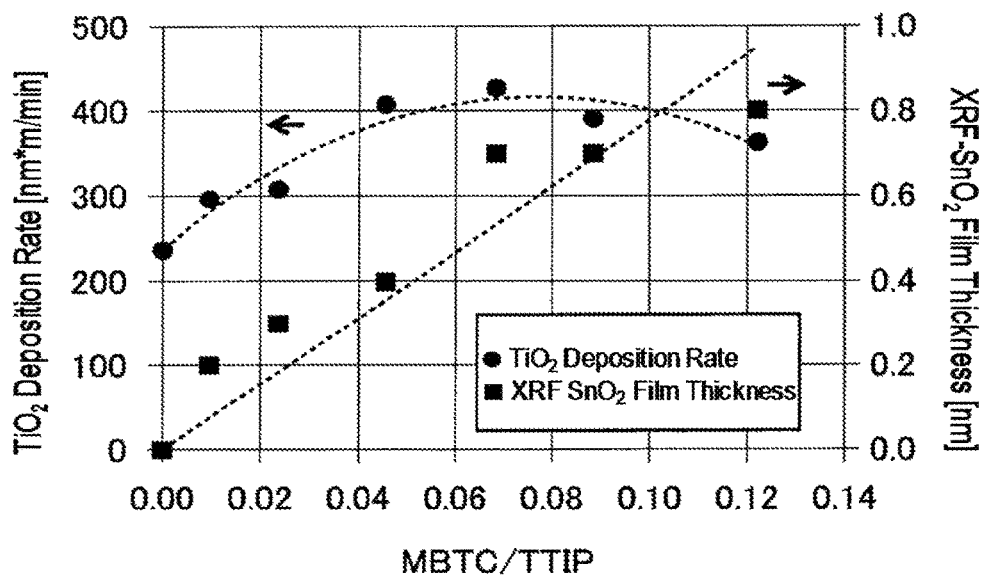
FIG. 5 is a graph showing a relationship between the concentration ratio of MBTC to TTIP (MBTC/TTIP) and the deposition rate of a $TiO_2$ thin film (nm·m/min) and also the content of $SnO_2$ in terms of film thickness (XRF-$SnO_2$ film thickness) (nm).

FIG. 5 shows a relationship between the concentration ratio of MBTC to TTIP (MBTC/TTIP) and the deposition rate of the TiO$_2$ thin film (nm·m/min) and also the content of SnO$_2$ in terms of film thickness (XRF-SnO$_2$ film thickness) (nm).

Measurement procedures of the deposition rate of the TiO$_2$ thin film and the content of SnO$_2$ in terms of film thickness are as follows.

Deposition rate of TiO$_2$ thin film: Ti count number on an X-ray fluorescence spectroscopic analyzer (XRF) is converted into film thickness.

Content of SnO$_2$ in terms of film thickness: Sn count number on an X-ray fluorescence spectroscopic analyzer (XRF) is converted into film thickness.

The film thickness is calculated by measuring a count (intensity) of each element in a thin film and a substrate by using an X-ray fluorescence spectroscopic analyzer (XRF, RIX 3000 manufactured by Rigaku Corporation) and applying the count to the following expressions.

Film thickness of TiO$_2$ thin film=4.7071×(Intensity of Ti in thin film−Intensity of Ti in substrate)+0.1204

Film thickness of SnO$_2$ thin film=4.957×(Intensity of Sn in thin film−Intensity of Sn in substrate)+0.1703

The coefficients in the above expressions are numerical values calculated based on standard samples.

As is apparent from FIG. 5, as the concentration ratio of MBTC to TTIP was increased, the deposition rate of the TiO$_2$ thin film and the content of SnO$_2$ in terms of film thickness were increased. The deposition rate of the TiO$_2$ thin film reached a maximum value at a concentration ratio of MBTC to TTIP of around 0.06.

Example 2

The present Example was carried out in the same manner as in Example 1 except that SnCl$_4$ was used as an auxiliary raw material and SnCl$_4$ was added in an amount of 0 to 0.10 as a concentration ratio to TTIP (SnCl$_4$ (mol %)/TTIP (mol %)).

Figure 6:
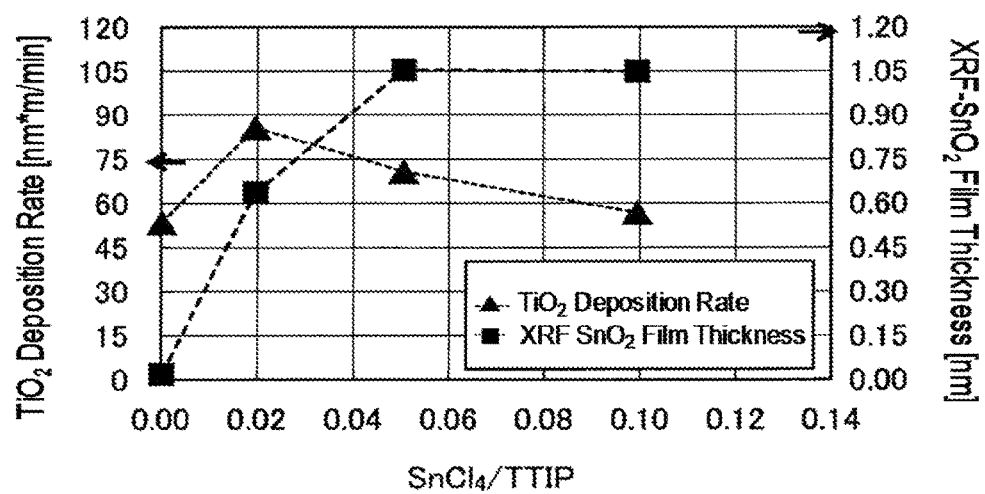
FIG. 6 is a graph showing a relationship between the concentration ratio of $SnCl_4$ to TTIP ($SnCl_4$/TTIP) and the deposition rate of a $TiO_2$ thin film (nm·m/min) and also the content of $SnO_2$ in terms of film thickness (XRF-$SnO_2$ film thickness) (nm).

FIG. 6 shows a relationship between the concentration ratio of SnCl$_4$ to TTIP (SnCl$_4$/TTIP) and the deposition rate of the TiO$_2$ thin film (nm·m/min) and also the content of SnO$_2$ in terms of film thickness (XRF-SnO$_2$ film thickness) (nm).

As is apparent from FIG. 6, as the concentration ratio of SnCl$_4$ to TTIP was increased, the deposition rate of the TiO$_2$ thin film and the content of SnO$_2$ in terms of film thickness were increased. The deposition rate of the TiO$_2$ thin film reached a maximum value at a concentration ratio of SnCl$_4$ to TTIP of around 0.02.

Example 3

The present Example was carried out in the same manner as in Example 1 except that MBTC was used as an auxiliary raw material and MBTC was added in an amount of 0.05 as a concentration ratio to TTIP (MBTC (mol %)/TTIP (mol %)). TiO$_2$ thin films having different film thickness in the range of 20 to 120 nm were formed and surface roughness Ra (nm) of TiO$_2$ thin films was measured by using an atomic force microscope (AFM, SPI-3800N/SPA400 manufactured by SII Nanotechnology Inc.) at a scanning area of 2.0 μm and an excitation voltage of 0.5 V.

Moreover, TiO$_2$ thin films having different film thickness in the range of 20 to 70 nm were formed without adding MBTC as an auxiliary raw material, and surface roughness Ra (nm) of TiO$_2$ thin films was measured.

Furthermore, while MBTC was added in an amount of 0.075 or 0.10 as a concentration ratio to TTIP (MBTC (mol %)/TTIP (mol %)), a TiO$_2$ thin film having a film thickness of 140 nm or 120 nm was formed and surface roughness Ra of TiO$_2$ thin films was measured.

FIG. 7 shows a relationship between the film thickness (nm) of the TiO$_2$ thin film and the surface roughness Ra (nm) of the TiO$_2$ thin film.

As is apparent from FIG. 7, in either case of the case where MBTC was added as an auxiliary raw material (represented by ●) and the case where MBTC was not added (represented by ○), as the film thickness of the TiO$_2$ thin film was increased, the surface roughness Ra of the TiO$_2$ thin film was increased. Moreover, as compared with the case where MBTC was not added as an auxiliary raw material, the surface roughness Ra of the TiO$_2$ thin film was increased in the case where MBTC was added. However, in the case where the concentration ratio of MBTC to TTIP was increased (represented by ▲), specifically, in the case where the concentration ratio of MBTC to TTIP was increased to 0.075 or 0.10, the surface roughness Ra of the TiO$_2$ thin film was decreased.

Example 4

The present Example was carried out in the same manner as in Example 1 except that MBTC was used as an auxiliary raw material and MBTC was added in an amount of 0 to 0.104 as a concentration ratio to TTIP (MBTC (mol %)/TTIP (mol %)).

Figure 8:
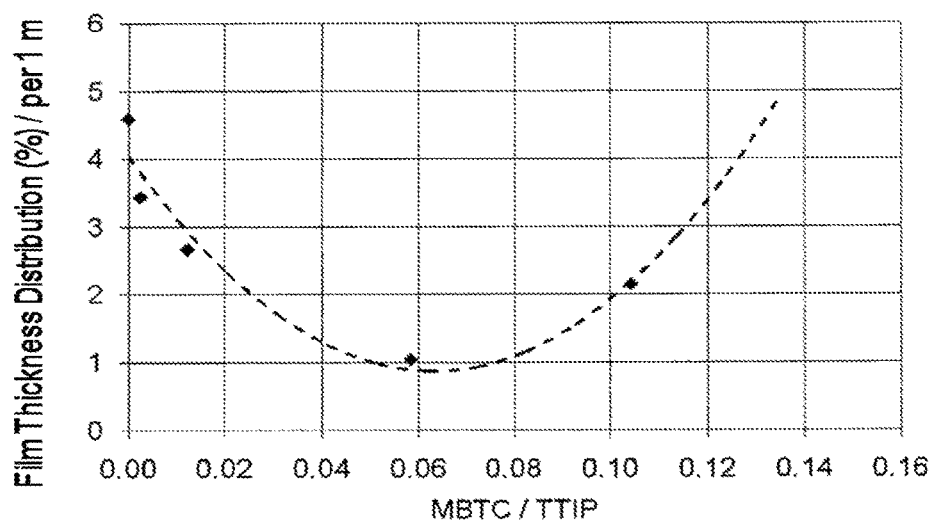
FIG. 8 is a graph showing a relationship between the concentration ratio of MBTC to TTIP (MBTC/TTIP) and the film thickness distribution (per 1 m of the width) of a $TiO_2$ thin film in a width direction.

FIG. 8 shows a relationship between the concentration ratio of MBTC to TTIP (MBTC/TTIP) and the film thickness distribution of the TiO$_2$ thin film. The film thickness distribution of the TiO$_2$ thin film is a numerical value per 1 m of the width of the TiO$_2$ thin film, and the film thickness distribution of the TiO$_2$ thin film was calculated by measuring the film thickness in a width direction of the substrate with an X-ray fluorescence spectroscopic analyzer (XRF).

As is apparent from FIG. 8, as the concentration ratio of MBTC to TTIP was increased, the film thickness distribution of the TiO$_2$ thin film was decreased. The film thickness distribution of the TiO$_2$ thin film reached a minimum value at a concentration ratio of MBTC to TTIP of around 0.06.

Example 5

The present Example was carried out in the same manner as in Example 1 except that MBTC was used as an auxiliary raw material and MBTC was added in an amount of 0 to 0.20 as a concentration ratio to TTIP (MBTC (mol %)/TTIP (mol %)).

Figure 9:
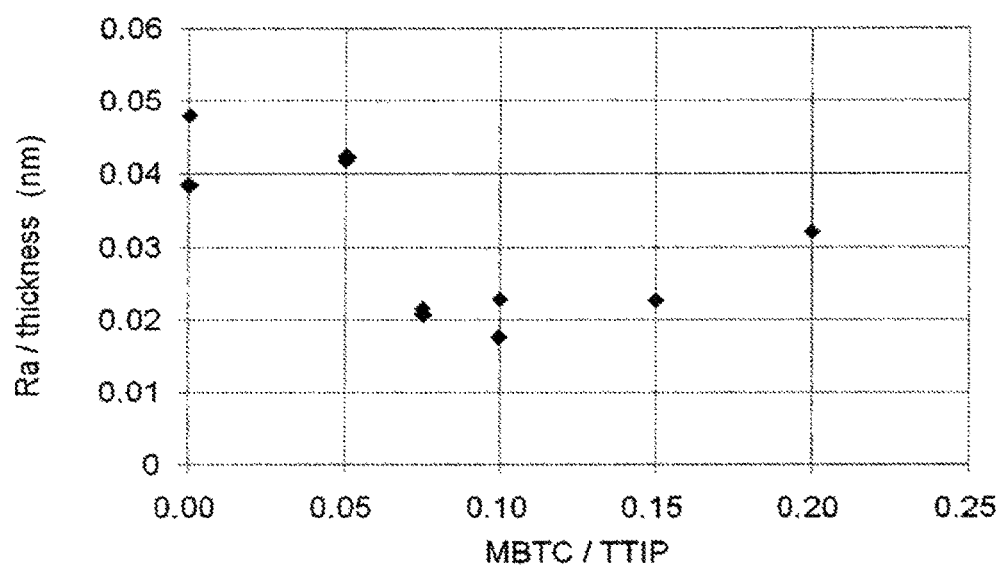
FIG. 9 is a graph showing a relationship between the concentration ratio of MBTC to TTIP (MBTC/TTIP) and the ratio of the surface roughness Ra (nm) to the film thickness t (nm) (Ra/t).

FIG. 9 shows a relationship between the concentration ratio of MBTC to TTIP (MBTC/TTIP) and the ratio of the surface roughness Ra (nm) to the film thickness t (nm) of the TiO$_2$ thin film (Ra/t). As is apparent from FIG. 9, by controlling the concentration ratio of MBTC to TTIP to 0.07 or more, the ratio of the surface roughness Ra to the film thickness t of the TiO$_2$ thin film (Ra/t) was decreased. Moreover, when it was controlled to 0.2, Ra/t was again increased.

While the present invention has been described in detail and with reference to specific embodiments thereof, it will be apparent to one skilled in the art that various changes and modifications can be made therein without departing from the spirit and scope of the present invention.

The present application is based on Japanese Patent Application No. 2013-238795 filed on Nov. 19, 2013 and Japanese Patent Application No. 2014-075636 filed on Apr. 1, 2014, and the contents thereof are incorporated herein by reference.

The invention claimed is:

1. A TiO$_2$ thin film obtained by an atmospheric pressure CVD method comprising:

supplying a raw material gas to a substrate; and reacting a Ti raw material contained in the raw material gas with oxygen to form the TiO$_2$ thin film on the substrate, wherein:

the raw material gas comprises, as the Ti raw material, titanium tetraisopropoxide (TTIP) and a chloride of a metal M vaporizable in a temperature range of 100 to 400° C.;

an amount of the chloride of the metal M is from 0.01 to 0.18 as a concentration ratio to the titanium tetraisopropoxide (TTIP) (chloride of metal M (mol %)/TTIP (mol %));

the TiO$_2$ thin film has a Cl content of $0.5 \times 10^{18}$ (atoms/cm$^3$) or more and $10 \times 10^{18}$ (atoms/cm$^3$) or less;

when a film thickness of the TiO$_2$ thin film is taken as L (nm), a content ratio of an oxide of a metal M in terms of film thickness is 0.002 L or more and 0.035 L or less, which is represented by a ratio of a content of the oxide of the metal M in terms of film thickness (virtual film thickness when replacement is performed with a thin film having a content of the oxide of the metal M of 100%) to the film thickness L of the TiO$_2$ thin film; and the TiO$_2$ thin film has a film thickness distribution in a width direction defined by the following expression of 4% or less per 1 m of the width:

Film thickness distribution (%)={((Maximum film thickness among measuring points)/(Average film thickness among measuring points)×100)−((Minimum film thickness among measuring points)/(Average film thickness among measuring points)×100)}/Measured width (m).

2. The TiO$_2$ thin film according to claim 1, wherein, when a film thickness of the TiO$_2$ thin film is taken as L (nm), a content ratio of an oxide of a metal M in terms of film thickness is 0.009 L or more and 0.035 L or less, which is represented by a ratio of a content of the oxide of the metal M in terms of film thickness (virtual film thickness when replacement is performed with a thin film having a content of the oxide of the metal M of 100%) to the film thickness L of the TiO$_2$ thin film.

3. The TiO$_2$ thin film according to claim 1, which has a film thickness distribution in a width direction defined by the following expression of 2% or less per 1 m of the width:

Film thickness distribution (%)={((Maximum film thickness among measuring points)/(Average film thickness among measuring points)×100)−((Minimum film thickness among measuring points)/(Average film thickness among measuring points)×100)}/Measured width (m).

4. The TiO$_2$ thin film according to claim 1, which has a ratio of a surface roughness Ra (nm) to a film thickness t (nm) (Ra/t) of 0.01 or more and 0.05 or less.

* * * * *